United States Patent [19]

Holloway et al.

[11] Patent Number: 5,407,869
[45] Date of Patent: Apr. 18, 1995

[54] METHOD OF PASSIVATING GROUP III-V SURFACES

[75] Inventors: Paul H. Holloway, Gainesville, Fla.; Yun Wang, Houston, Tex.

[73] Assignee: University of Florida, Gainesville, Fla.

[21] Appl. No.: 787,906

[22] Filed: Nov. 6, 1991

[51] Int. Cl.⁶ .......................................... H01L 21/02
[52] U.S. Cl. .................................... 437/236; 437/235
[58] Field of Search .................. 437/236, 237, 235; 148/DIG. 56

[56] References Cited

PUBLICATIONS

Hwang, A study of new surface passivation using phosphorus sulfide/ammonium sulfide ($P_2S_5$/$(NH_4)_2S$) on gallium asrenide Schottky barrier diodes, chemical Abstracts, CA112(20): 189735p, J. Appl. Phys. 67(4), 15 Feb. 1990, pp. 2162–2165.

Primary Examiner—R. Bruce Breneman
Attorney, Agent, or Firm—Kerkam, Stowell, Kondracki & Clarke; Dennis P. Clarke

[57] ABSTRACT

A method of passivating a surface of a Group III–V compound substrate comprising exposing the surface to a solution comprising $P_2S_5$, S and $(NH_4)_2S$ for a time sufficient to prevent formation of segregated surface atoms and oxides on the substrate surface, thereby minimizing the density of surface states thereof, the solution containing $P_2S_5$, S and $(NH_4)_2S$ in a ratio.

16 Claims, No Drawings

METHOD OF PASSIVATING GROUP III-V SURFACES

BACKGROUND OF THE INVENTION

Research leading to the completion of the invention was supported, in part, by Grant No. MDA 972-88-J-1006 issued by the Defense Advanced Research Agency (DARPA) of the United States Department of Defense. The United States Government has certain rights with respect to the invention described and claimed herein.

FIELD OF THE INVENTION

The present invention relates to methods for passivating Group III-V surface layers and, in particular, GaAs.

DESCRIPTION OF THE PRIOR ART

Gallium arsenide and other Group III-V type semiconductor materials are highly valued for fabricating high performance semiconductor components. These materials, however, are susceptible to environmental degradation. The poor electronic quality of the degraded Group III-V surfaces is caused by the high density of the surface states thereon created by oxidation reactions. Deep level traps are produced as a result of oxidation which pin the Fermi level and increase non-radiative recombination.

Arsenic atoms and oxides are the main cause for the deep level traps which pin the Fermi level and increase the non-radiative recombination [Aspnes, Surf. Sci., Vol. 132, p. 406 (1983); Henry et al, J. Appl. Phys., Vol. 49, p. 3530 (1978); Chang et al, Appl. Phys. Lett., Vol. 33, p. 341 (1978)]. This inherent problem has limited the performance of existing GaAs-based electronic and electro-optical devices and has still prevented the successful development of GaAs-based MIS technology.

The principal culprit in degradation of Group III-V surfaces is the presence of oxygen that is difficult to exclude. In the case of GaAs, the presence of oxygen causes oxidation of GaAs to arsenic oxide and gallium oxide. The gallium atoms in the vicinity of the arsenic oxide gradually extract oxygen from arsenic oxide to form gallium oxide, leading to the segregation of the arsenic atoms.

Recently, there has been a renewed interest in improving the poor electronic quality of GaAs surfaces [Offsey et al, Appl. Phys. Lett., Vol. 48, p. 475 (1986); Sandroff et al, Appl. Phys. Lett., Vol. 51, p. 33 (1987); Yablonovitch et al, Appl. Phys. Lett., Vol. 51, p. 439 (1987); and Skromme et al, Appl. Phys. Lett., Vol. 51, p. 2022 (1987)] which is caused by the high density of surface states on GaAs formed by segregated arsenic atoms [Spicer et al, J. Vac. Sci. Technol., Vol. 16, p. 1422 (1979)] via oxidation reactions [Lee et al, Electrochem., Vol. 135, p. 496 (988)].

Known surface passivation methods for Group III-V compound semiconductors of which GaAs is the most important and the most difficult to passivate are of three types.

The first method utilizes deposited films such as $SiO_2$, $Si_3N_4$, $Al_2O_3$ and $P_2O_5$ which are known from their use as passivation films for the surfaces of silicon semiconductors. These approaches suffer from the drawback that the deposition temperature is relatively high. $SiO_2$ films tend to take in Ga from the surface of a substrate made of GaAs or GaP, and will damage the stoichiometry of the surface of the substrate.

The second method is to form a native oxide film corresponding to a thermal oxidation film of silicon in place of the deposited film suggested above by, for example, an anodic oxidation method. Anodic oxidation methods have the disadvantage that they are thermally unstable. The quality of the film will change substantially at a temperature below the temperature range adopted for thermal diffusion of impurities and post-ion implantation annealing.

The third approach is to perform chemical oxidation by the use of, for example, hot hydrogen peroxide solution. This method is disadvantageous by virtue of the limitation in the thickness of the oxide film which is formed.

The success of any passivating technique hinges on choosing a species that makes a strong bond with the surface and, at the same time, has a higher heat of oxide formation than that of gallium oxide since the thermodynamic equilibrium of the composition greatly favors the formation of gallium oxide over arsenic oxide because of the higher heat of formation of gallium oxide. The first requirement can be satisfied by choosing a chemical species that absorbs strongly on the GaAs surface as an impenetrable passivating barrier. Thus, a species that chemisorbs strongly must be chosen. A chemisorbing species such as phosphorus compounds occupy the active surface sites, thereby preventing adsorption of other species.

Recently, Lee et al disclosed in U.S. Pat. No. 4,871,672 a method of passivating a surface of a Group III-V compound substrate comprising exposing the surface to a compound having the formula A-B, wherein a is an element having a heat of oxide formation greater than the heats of oxide formation of Group III and V elements, and B is an element selected from the group consisting of S, Se, Te and Po, the compound A-B preferably being a member selected from the group consisting of $P_2S_5$, $P_2Se_5$, $P_2Te_5$ and $P_2Po_5$ and mixtures thereof for a time sufficient for deposition/chemisorption thereon of an amount of $P_2S_5$ sufficient to prevent formation of segregated surface atoms and oxides, thereby minimizing the density of surface states and unpinning pinned Fermi levels thereof.

It is an object of the present invention to provide an improved method for passivating Group III-V surfaces which increases photoluminescence (PL) intensity to levels heretofore never achieved.

SUMMARY OF THE INVENTION

The above and other objects are realized by the present invention which provides a method of passivating a surface of a Group III-V compound substrate comprising exposing the surface to a solution comprising $P_2S_5$, S and $(NH_4)_2S$ in concentrations and for a time sufficient to prevent formation of segregated surface atoms and oxides on the substrate surface, thereby minimizing the density of surface states thereof, the solution containing $P_2S_5$, S and $(NH_4)_2S$ in a ratio, respectively, of about 0.1 g/0.1 g/mL.

DETAILED DESCRIPTION OF THE INVENTION

A major obstacle to the fabrication of Group III-V compounds, typically GaAs-based electronic and optoelectronic devices, has been the poor qualities of the semiconductor surface. The problem lies in the fact that GaAs characteristically has a high density of surface states. These surface states have been shown to pin the surface Fermi level near the middle of forbidden gap and to cause a higher surface recombination velocity at the GaAs surface [Spicer et al, J. Vac. Sci. Technol., Vol. B6, pp. 1245–1251 (1988); Woodall et al, J. Vac. Sci. Technol., Vol. 19, pp. 794–798 (1981)]. Due to the pinning of the surface Fermi level, the barrier height of a GaAs Schottky contact is independent of the metal work function [Woodall et al, supra]. The GaAs-insulator interface does not permit control of charge in the semiconductor for the same reason. Consequently, the GaAs metal-insulator-semiconductor field-effect-transistor (MISFET) has not been realized.

The strategy to achieve the above objective is to form a passivation layer on GaAs. This passivation layer may be as thin as a single monolayer, but its formation should considerably limit the density of surface states on GaAs, while not adversely affecting the device performance characteristics. The element responsible for the formation of this passivation layer should have values of lattice constant and thermal expansion coefficient close to those of GaAs in order to prevent the formation of interfacial defects and stress.

An effective passivation layer should have a negligible density of defects at the passivation layer/GaAs interface. In addition, the bonding between the passivation layer and GaAs should be strong enough to avoid dissociation of either the passivation layer or the GaAs surface during device fabrication, making strong covalent bonding desirable. The covalent bonding may also prevent charge formation at the interface, which might affect the equilibrium band bending in the semiconductor.

Sulfur is particularly effective in passivating the GaAs surface since it can bond to GaAs to form many stable compounds [Carpenter et al, Appl. Phys. Lett., Vol. 53, p. 66 (1988); Sandroff et al, J. Vac. Sci. Technol., Vol. B7, pp. 841–844 (1989)]. However, its passivation effectiveness has been limited by the existing sulfur sources [Besser et al, Appl. Phys. Lett., Vol. 52, pp. 1707–1709 (1988); Carpenter et al, supra; Waldrop, J. Vac. Sci. Technol. Vol. B3, p. 1197 (1985)]. Many studies have shown that sulfide compounds can only passivate the GaAs surface temporarily [Sandroff et al, Appl. Phys. Lett., Vol. 51, p. 33 (1987); Lee et al, Appl. Phys. Lett., Vol. 54, p. 724 (1989)].

The new sulfur passivation method of the invention uses $P_2S_5$, pure S and $(NH_4)_2S$ compounds in a critical ratio, the process leading to successful surface passivation of GaAs. Preferably, the solution contains $P_2S_5$, S and $(NH_4)_2S$, respectively, in a ratio of up to about 0.2 g/0.2 g/mL; most preferably in a ratio of from about 0.1 g/0.1 g/mL to about 0.2 g/0.2 g/mL.

EXAMPLE

A wafer sample of GaAs is first cleaned with trichloroethane, acetone, methanol and deionized water sequentially. The cleaned sample is etched by being dipped in a solution of $NH_4OH/H_2O_2/H_2O$ (1:1:16) for 30 seconds and then immediately rinsed with deionized water. The sample is immersed in a solution of $NH_4OH/H_2O$ (1:2) for 10 minutes to be further etched and then washed in flowing deionized water for 1 minute. In the passivating step, the sample is soaked for 10 minutes in a solution of $P_2S_5/S/(NH_4)_2$ consisting of phosphorus pentasulfide ($P_2S_5$), pure sulfur (S) and ammonium sulfide ($(NH_4)_2S$) in a ratio of 0.1 g/0.1 g/mL. The sample is blown dry with nitrogen gas immediately after being removed from the passivation solution.

The new passivation method of the invention greatly improves the surface/interface optical and electrical properties of GaAs. Unlike previous methods, the process of the invention calls for a solution consisting of $P_2S_5$, pure S and $(NH_4)_2S$ in an appropriate ratio. The PL intensity of the GaAs sample passivated with this solution in the authors' research was improved by a factor of 27.5. Previous passivation methods using $P_2S_5/NH_4OH$ only increased PL intensity by a factor of 5 [Lee et al, supra]. The metal (Au) semiconductor Schottky barrier height was increased from 0.91 eV to 1.11 eV even four months after passivation with the technique of the invention. However, previous passivation methods using $P_2S_5/(NH_4)_2S$ only increased the Au—GaAs Schottky barrier height to 0.99 eV [Hwang et al, J. Appl. Phys., Vol. 67, p. 2162 (1990)]. The improvement in both PL intensity and Schottky barrier height of Au—GaAs is larger than in previously reported treatments. In addition, the surface passivated with the passivation technique of the invention is more stable in air environment than surfaces passivated with previous methods. The time-dependent measurement of PL, Au—GaAs Schottky barrier height and the surface structural analysis with X-ray photoelectron spectroscopy (XPS) consistently indicate that the surface is passivated and stabilized in air environment more than one month after passivation with the technique of the invention. Surface passivation with previous methods only lasted several days.

The GaAs surface passivated with the process of the invention has great potentials in a variety of electronic and opto-electronic device applications. The most important semiconductor device, MISFET, may be realized utilizing the new passivation technique of the invention.

The method of the invention is applicable for the passivation of any suitable Group III–V surface such as GaAs, $Al_xGa_{1-x}As$, $In_xGa_{1-x}As$, $In_xGa_{1-x}As_yP_{1-y}$, InSb and AlSb, but is particularly adapted for the passivation of GaAs surfaces.

Cleaning of the croup III–V surface may be accomplished in a variety of ways. The solvents useful for removing any organic and/or hydrocarbon impurities include acetone, methyl alcohol, ethyl alcohol and trichlorethane, either at room temperature or in an ultrasonic agitator.

The cleaned Group III–V surface is also preferably etched prior to passivation. Etching of the surface thins the native oxide in order to facilitate its complete removal during sulfur passivation. In addition, the etching helps ensure the removal of organic and hydrocarbon contaminants.

Suitable etchants include $H_2SO_4/H_2O_2/H_2O$, $H_3PO_4/H_2O_2/H_2O$, $HCl/H_2O_2/H_2O$, $K_2Cr_2O_7/H_2SO_4/HCl$, $Br/CH_3OH$, NaOH, KOH, $HNO_3$, citric acid/$H_2O_2$ and $HClO_4$.

Generally, the clean, etched surface may be passivated by exposing it to the passivating solution for a time period of from about 10 sec to about 60 min, and preferably about 10 minutes.

We claim:

1. A method of passivating a surface of a Group III–V compound substrate comprising exposing said surface to a solution comprising $P_2S_5$, S and $(NH_4)_2S$ in concentrations and for a time sufficient to prevent formation of segregated surface atoms and oxides on said substrate surface, thereby minimizing the density of surface states thereof; said solution containing $P_2S_5$, S and $(NH_4)_2S$ in a ratio, respectively, of up to about 0.2 g/0.2 g/mL.

2. The method of claim 1 wherein said passivation is achieved by exposing said substrate surface to said solution for a period of time of from about 10 sec to about 60 min.

3. The method of claim 1 wherein said solution contains $P_2S_5$, S and $(NH_4)_2S$ in a ratio, respectively, of from about 0.1 g/0.1 g/mL to about 0.2 g/0.2 g/mL.

4. The method of claim 1 including a step of cleaning said substrate surface prior to said passivation.

5. The method of claim 4 wherein said substrate surface is cleaned by exposure to one or more solvents.

6. The method of claim 5 wherein said substrate is cleaned by exposure to trichloroethane, acetone, methanol and deionized water sequentially.

7. The method of claim 4 wherein said cleaned substrate surface is etched prior to said passivation.

8. The method of claim 7 wherein said cleaned substrate is etched in a solution comprising $NH_4OH$, $H_2O_2$ and $H_2O$.

9. The method of claim 8 wherein said solution comprises $NH_4OH/H_2O_2/H_2O$ in about 1:1:16 weight ratio.

10. The method of claim 9 wherein said substrate is etched for about 30 seconds.

11. The method of claim 10 wherein said etched surface is immediately rinsed in deionized water.

12. The method of claim 11 wherein said etched surface is further etched in a second etching solution comprising $NH_4OH$ and $H_2O$.

13. The method of claim 12 wherein said second etching step is carried out for about ten minutes.

14. The method of claim 12 wherein the weight ratio of $NH_4OH$ to $H_2O$ in said second etching solution is about 1:2.

15. The method of claim 14 wherein said re-etched surface is washed in deionized water to remove said second etching solution therefrom.

16. The method of claim 2 wherein said period of time is about ten minutes.

* * * * *